(12) United States Patent
Whitefield et al.

(10) Patent No.: US 7,653,523 B2
(45) Date of Patent: Jan. 26, 2010

(54) METHOD FOR CALCULATING HIGH-RESOLUTION WAFER PARAMETER PROFILES

(75) Inventors: Bruce Whitefield, Camas, WA (US); David Abercrombie, Gresham, OR (US)

(73) Assignee: LSI Corporation, Milpitas, CA (US)

( * ) Notice: Subject to any disclaimer, the term of this patent is extended or adjusted under 35 U.S.C. 154(b) by 629 days.

(21) Appl. No.: 10/736,386

(22) Filed: Dec. 15, 2003

(65) Prior Publication Data
US 2005/0132308 A1  Jun. 16, 2005

(51) Int. Cl.
G06F 17/10 (2006.01)
G06F 17/50 (2006.01)

(52) U.S. Cl. ............................................ 703/13; 703/2
(58) Field of Classification Search ................... 438/14; 703/13, 14, 2; 702/150
See application file for complete search history.

(56) References Cited

U.S. PATENT DOCUMENTS

| | | | |
|---|---|---|---|
| 5,787,190 A | 7/1998 | Peng et al. | |
| 5,864,394 A * | 1/1999 | Jordan et al. | 356/237.2 |
| 5,982,920 A | 11/1999 | Tobin et al. | |
| 6,067,507 A | 5/2000 | Beffa | |
| 6,070,004 A * | 5/2000 | Prein | 716/10 |
| 6,185,707 B1 | 2/2001 | Smith et al. | |
| 6,393,602 B1 | 5/2002 | Atchison et al. | |
| 6,477,685 B1 | 11/2002 | Lovelace | |
| 6,775,630 B2 | 8/2004 | Behkami et al. | |
| 6,847,855 B2 * | 1/2005 | Poeppel | 700/110 |
| 6,885,950 B2 * | 4/2005 | Mitsutake et al. | 702/58 |
| 6,986,112 B2 | 1/2006 | Whitefield et al. | |
| 7,013,192 B2 | 3/2006 | Whitefield et al. | |
| 7,039,556 B2 | 5/2006 | Whitefield et al. | |
| 7,065,239 B2 * | 6/2006 | Maayah et al. | 382/145 |
| 2002/0121915 A1 | 9/2002 | Alonso Montull et al. | |
| 2003/0229410 A1 | 12/2003 | Smith et al. | |
| 2004/0162692 A1 | 8/2004 | Ye et al. | |
| 2004/0267477 A1 | 12/2004 | Scott et al. | |
| 2005/0039089 A1 * | 2/2005 | Gedamu et al. | 714/718 |
| 2005/0060336 A1 | 3/2005 | Abercrombie et al. | |
| 2005/0132308 A1 | 6/2005 | Whitefield et al. | |
| 2005/0227587 A1 | 10/2005 | Yang | |
| 2005/0278678 A1 | 12/2005 | Whitefield et al. | |
| 2006/0031788 A1 | 2/2006 | Bauer | |
| 2006/0059452 A1 | 3/2006 | Whitefield et al. | |
| 2006/0085155 A1 | 4/2006 | Miguelanez et al. | |
| 2008/0021677 A1 * | 1/2008 | Buxton et al. | 702/184 |

OTHER PUBLICATIONS

Abugov et al.; A Yield Based Replacement for Capability Indexes; 1995 IEEE/SEMI Advanced Semiconductor Manufacturing Conference; pp. 209-212.*

Abercrombie et al. (inventors), Method for Calculating High-Resolution Wafer Parameter Profiles; 2004 IEEE/SEMI Advanced Semiconductor Manufacturing Conference, pp. 119-123.*

* cited by examiner

*Primary Examiner*—Hugh Jones
(74) *Attorney, Agent, or Firm*—Trexler, Bushnell, Giangiorgi, Blackstone & Marr, Ltd.

(57) ABSTRACT

An embodiment of the present invention provides a method to utilize data from many different die sizes and products so that highly detailed wafer profiles can be generated that have an improved signal to noise ratio and spatial resolution. Instead of being limited to single die size like normal wafer maps, this method takes advantage of multiple die sizes and their variation in placement on the wafer to increase the information available about the wafer patterns.

21 Claims, 2 Drawing Sheets

METHOD FOR CALCULATING HIGH-RESOLUTION WAFER PARAMETER PROFILES

BACKGROUND OF THE INVENTION

The present invention generally relates to a method for calculating high-resolution wafer parameter profiles.

Integrated circuit yields on wafers frequently follow patterns across the wafer. Analysis of these patterns is useful in determining the source of process variations or yield loss. An observed pattern can be matched against the physical characteristics of a process tool or the patterns observed by other techniques such as particle inspections.

Typically, the wafer patterns are observed by plotting yields or some other parametric value of a specific device by die in what is known as a wafer map. This is useful when working with obvious patterns that stand out given the die size or number of data points available to be plotted. This approach has limited value when dealing with very large die or when there is limited data from a given product or when the impact is relatively low compared to the background variation, i.e., a poor signal to noise ratio.

The typical approaches for generating wafer profiles are:
1) Stacking data from the die of many wafers of the same product into what is known as a stacked wafer map;
2) Using data from the smallest die sized product in order to have a higher spatial resolution; and
3) Using the data from methods 1 or 2 above to interpolate values in between die locations through the use of statistical smoothing algorithms. These results are sometimes known as response surface plots or contour maps.

The foregoing approaches, however, are typically met with the following problems:
1) When using data from only one product there may be only a limited number of data points per die location availed from that product in the time frame of interest;
2) If the die size is relatively large for the selected product, the spatial resolution will be poor and important patterns will not be resolved; and
3) The accuracy of statistical interpolations using the above data will be limited in accuracy based on the data used.

OBJECTS AND SUMMARY OF THE INVENTION

A primary object of an embodiment of the present invention is to provide a method to utilize data from many different die sizes and products so that highly detailed wafer profiles can be generated that have an improved signal to noise ration and spatial resolution.

Another primary object of an embodiment of the present invention is to provide sufficient resolution of patterns that occur across the wafer.

An object of an embodiment of the present invention is to match wafer yield patterns with physical wafer contact points in process equipment in order to troubleshoot and improve the process or equipment.

Another object of an embodiment of the present invention is to adjust die placement on the wafer in order to maximize yields.

Another object of an embodiment of the present invention is to match wafer yield or electrical test patterns with etch clearing patterns, such as center last, to facilitate recipe optimization.

Yet another object of an embodiment of the present invention is to provide better resolution of spatial patterns on a wafer than the data from any single product can provide.

Still another object of an embodiment of the present invention is that normalizing and smoothing across the multiple products provides a map that better represents the process-induced patterns as opposed to any product specific pattern.

Another object of an embodiment of the present invention is that the absolute physical coordinate system allows the data to be correlated to physical causes and use as data for modeling.

Briefly, and in accordance with at least one of the foregoing objects, an embodiment of the present invention provides a method to utilize data from many different die sizes and products so that highly detailed wafer profiles can be generated that have an improved signal to noise ratio and spatial resolution. Instead of being limited to single die size like normal wafer maps, this method takes advantage of multiple die sizes and their variation in placement on the wafer to increase the information available about the wafer patterns.

BRIEF DESCRIPTION OF THE DRAWINGS

The organization and manner of the structure and operation of the invention, together with further objects and advantages thereof, may best be understood by reference to the following.

DESCRIPTION

Figure 1:
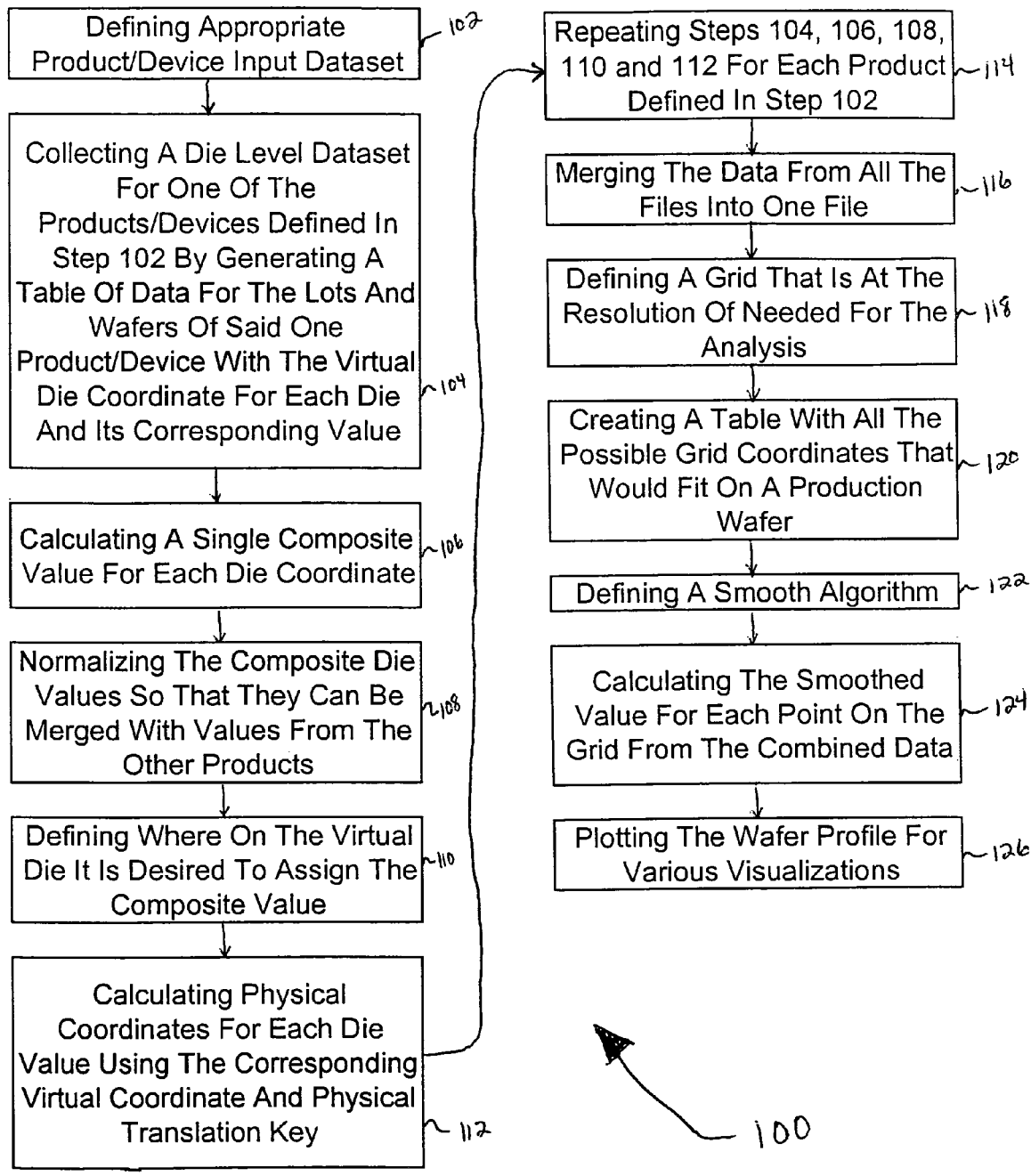
FIG. 1 illustrates a flow chart of a method for calculating high-resolution wafer parameter profiles.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

In this invention, the die from many different products is used to create a high-resolution profile of the wafer. This is done by associating die-based values to a standard grid based on the location of the die with respect to that grid. The procedure will work for any die-based data such as yields, or electrical test values. It can also be applied to wafer based measurements that are limited specific structures location in the wafer scribe area such as gate oxide thickness or line width measurements. The concept is that by using data from die of different sizes more information about the patterns on the wafers can be determined.

Thus, a method 100 for calculating high-resolution wafer parameter profiles is illustrated in the flow chart of FIG. 1.

The method 100 includes step 102, which is to define appropriate product/device input dataset. The appropriate product/device input dataset are defined by the following:
1. A variety of devices with die level data and different die sizes;
2. Products/devices must represent the same process flow to be modelled;
3. Sufficient number of lots from each device to calculate a reasonable average result value for each die;
4. Die size for each device; and
5. At least one reference physical correlation point between a specific virtual coordinate (i.e., row-column) and an actual physical location on the wafer (e.g., center of wafer).

Table 1, for example, is a list of products used in the dataset defined by step 102.

TABLE 1

List Of Products Used In Dataset

| Chip Code | Die X size | Die Y size | Upper/Left Corner (64, 64) X | Upper/Left Corner (64, 64) Y | Status | Note |
|---|---|---|---|---|---|---|
| CD3B | 5.703 | 5.775 | −26.512 | 92.4 | Used | |
| CD34 | 8.508 | 8.478 | −25.624 | 93.536 | Used | |
| CP9B | 10.743 | 10.716 | −32.229 | 90.944 | Used | |
| CP8Q | 11.907 | 11.88 | −42.721 | 86.64 | Used | |
| CP9R | 5.808 | 5.976 | −26.132 | 92.616 | Used | |
| CD3Z | 13.734 | 13.38 | −34.368 | 86.96 | Used | |
| CL1L | 6.654 | 6.627 | −19.308 | 94.705 | Used | |
| CD3Y | 15.135 | 14.478 | −45.405 | 85.068 | Used | |
| CPCB | 3.603 | 2.973 | −18.815 | 95.136 | Used | |
| CP0L | 13.839 | 13.686 | −34.578 | 87.402 | Not Used | Rotated |
| AS0P | 9.402 | 9.243 | −28.204 | 92.43 | Not Used | Rotated |
| CD5A | 8.283 | 8.283 | −35.849 | 91.196 | Not Used | Only 3 Lots |
| CD39 | 3.909 | 3.879 | −17.536 | 95.275 | Not Used | Only 2 Lots |

It should be noted that in Table 1, the upper/left corner x and y columns identify the physical location in millimeters of the top-left corner of the top-left die on a wafer for that product as referenced from the center of the wafer. Any reference coordinate method could be used as long as it makes a physical to virtual association and is used consistently across the devices.

The method 100 further includes step 104, which is to collect a die level dataset for one of the products/devices defined in step 102, see Table 1, by generating a table of data for the lots and wafers of a given product/device with the virtual die coordinate (i.e., row-column) for each die and its corresponding value (i.e., yield bin, parametric measurement, etc.).

Table 2, for example, is an example die level yield bin data for a product/device.

TABLE 2

Example Die Level Yield Bin Data For A Product/Device

| Index Row | Index7 Column | Bin # Lot 1: Wafer 1 | Bin # Lot 1: Wafer 2 | Bin # Lot 2: Wafer 1 | Bin # Lot 2: Wafer 2 |
|---|---|---|---|---|---|
| 56 | 60 | 9 | 8 | 9 | 8 |
| 56 | 59 | 8 | 9 | 8 | 15 |
| 56 | 57 | 8 | 15 | 8 | 15 |
| 56 | 58 | 12 | 15 | 8 | 15 |
| 56 | 56 | 8 | 15 | 9 | 15 |
| 57 | 56 | 8 | 9 | 8 | 9 |
| 57 | 57 | 1 | 9 | 9 | 9 |
| 57 | 58 | 8 | 8 | 9 | 12 |
| 57 | 59 | 8 | 8 | 9 | 8 |
| 57 | 61 | 8 | 9 | 8 | 8 |
| 57 | 62 | 8 | 9 | 8 | 8 |
| 57 | 60 | 1 | 8 | 8 | 8 |
| 57 | 54 | 1 | 8 | 9 | 8 |
| 57 | 55 | 8 | 8 | 9 | 12 |
| 58 | 55 | 1 | 8 | 9 | 8 |
| 58 | 63 | 8 | 8 | 9 | 9 |
| 58 | 54 | 8 | 9 | 8 | 9 |
| 58 | 53 | 8 | 9 | 8 | 8 |
| 58 | 60 | 1 | 8 | 8 | 8 |

The method 100 further includes the step 106, which is to calculate a single composite value for each die coordinate. This could be an average, max, sum, percentage, etc. of the data from all the individual lots and wafers corresponding die site. In the example in Table 3, the percent of bin 1 die from each location was calculated.

TABLE 3

Example Composite Value Data For Each Die Coordinate

| Index Row | Index Column | % Die Yield |
|---|---|---|
| 93 | 26 | 0.057 |
| 93 | −25 | 0.249 |
| 93 | 0 | 0.203 |
| 93 | 9 | 0.082 |
| 93 | 17 | 0.094 |
| 93 | −17 | 0.187 |
| 85 | −42 | 0.315 |
| 85 | −25 | 0.612 |
| 85 | 43 | 0.189 |
| 85 | 34 | 0.383 |
| 85 | −34 | 0.490 |
| 85 | 9 | 0.461 |
| 85 | 26 | 0.425 |
| 85 | 0 | 0.566 |

The method 100, further includes the step 108, which is to normalize the composite die values so that they can be merged with values from the other products, if necessary. For example, yields vary by product and die size and cannot be used together without normalization. Any normalization algorithm could be used (e.g., Poisson Defect Density, max-min scaling, etc.). In Table 4, a max-min scaling was used where the range of the yield was adjusted to scale from 0 to 1.

TABLE 4

Normalized Values

| Index Row | Index Column | % Die Yield | % Norm Yield |
|---|---|---|---|
| 93 | 26 | 0.057 | 0.068 |
| 93 | −25 | 0.249 | 0.296 |
| 93 | 0 | 0.203 | 0.242 |
| 93 | 9 | 0.082 | 0.098 |
| 93 | 17 | 0.094 | 0.111 |
| 93 | −17 | 0.187 | 0.223 |
| 85 | −42 | 0.315 | 0.375 |
| 85 | −25 | 0.612 | 0.728 |
| 85 | 43 | 0.189 | 0.224 |
| 85 | 34 | 0.383 | 0.455 |
| 85 | −34 | 0.490 | 0.583 |
| 85 | 9 | 0.461 | 0.549 |
| 85 | 26 | 0.425 | 0.506 |
| 85 | 0 | 0.566 | 0.673 |

Figure 2:
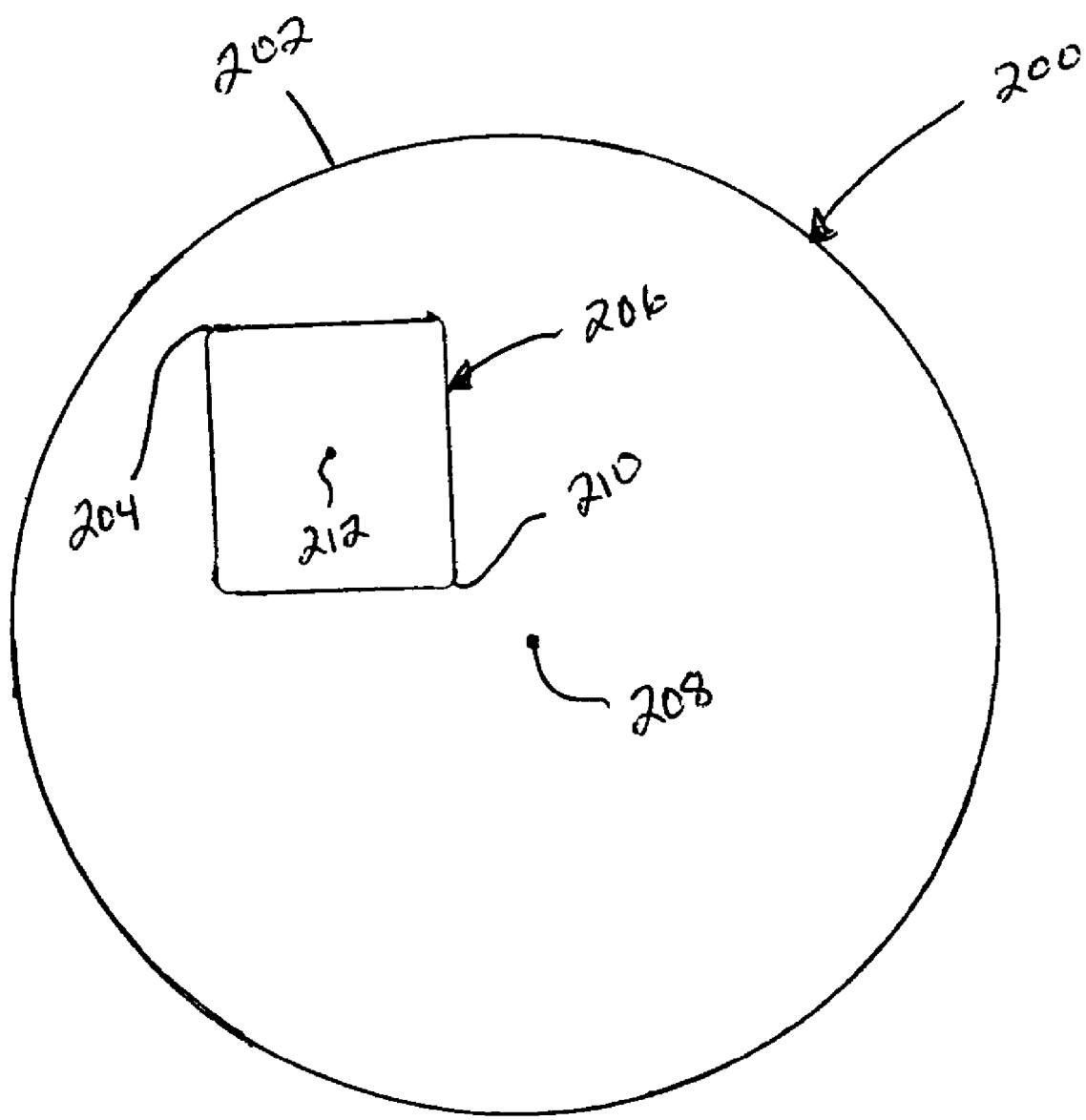
FIG. 2 illustrates a top view of a die on a wafer.

The method 100 further includes the step 110, which is to define where on the virtual die it is desired to assign the composite value. The location assignment depends on the purpose of the composite profile. For example, and as illustrated in FIG. 2, if it is believed that the value being measured for each die is driven by its nearness to the edge 202 of the wafer 200, the value could be assigned to the corner 204 of the die 206 nearest the edge 202 of the wafer 200. If, however, the purpose is to assess a mechanism stemming from the center 208 of the wafer 200, the value could assigned to the corner 210 of the die 206 nearest the center 208 of the wafer 200. If, however, there is no specific mechanism in mind, the value could be associated with the center 212 of the die 206.

The method 100 further includes the step 112, which is to calculate physical coordinates for each die value using the corresponding virtual coordinate and physical translation key. Using the virtual to physical translation key in the product information, Table 1, calculate a physical point on which to associate the value for each virtual die location.

TABLE 5

Physical Coordinates (X mm & Y mm)

| Index Row | Index Column | Index X mm | Index Y mm | % Die Yield | % Norm Yield |
|---|---|---|---|---|---|
| 93 | 26 | 10.5 | 2.5 | 0.057 | 0.068 |
| 93 | −25 | 10.5 | −2.5 | 0.249 | 0.296 |
| 93 | 0 | 10.5 | −0.5 | 0.203 | 0.242 |
| 93 | 9 | 10.5 | 0.5 | 0.082 | 0.098 |
| 93 | 17 | 10.5 | 1.5 | 0.094 | 0.111 |
| 93 | −17 | 10.5 | −1.5 | 0.187 | 0.223 |
| 85 | −42 | 9.5 | −4.5 | 0.315 | 0.375 |
| 85 | −25 | 9.5 | −2.5 | 0.612 | 0.728 |
| 85 | 43 | 9.5 | 4.5 | 0.189 | 0.224 |
| 85 | 34 | 9.5 | 3.5 | 0.383 | 0.455 |
| 85 | −34 | 9.5 | −3.5 | 0.490 | 0.583 |
| 85 | 9 | 9.5 | 0.5 | 0.461 | 0.549 |
| 85 | 26 | 9.5 | 2.5 | 0.425 | 0.506 |
| 85 | 0 | 9.5 | −0.5 | 0.566 | 0.673 |

Any coordinate system could be used (e.g., Cartesian, polar, etc.). In this example, a Cartesian coordinate system was used and the location is a combination of offset translations:

$X$Coord=(wafer translation in $x$)+(column translation in $x$)+(die translation in $x$)

$Y$Coord=(wafer translation in $y$)+(row translation in $y$)+(die translation in $y$)

1. The wafer translation is given in the reference coordinate from Table 1 ($W_x$ and $W_y$).
2. The column translation is calculated as the number of columns between the reference die and the die in question times the die width ($\Delta C$ times $D_x$).
3. The row translation similarly is calculated as the number of rows between the reference die and the die in question times the die height ($\Delta R$ times $D_y$).
4. The die translation is the distance between the reference point on the reference die and the position in the die where it is desired to place the value in the die ($DT_x$, $DT_y$). For example, the value can be placed at the corner of the die nearest the edge of the wafer, so a die in the upper right quadrant would use the upper right corner of the die which is one die width right of the reference die which is identified at the upper left corner.

Thus:

$F_x = W_x + \Delta C \cdot D_x + DT_x$ and $F_y = W_y + \Delta R \cdot D_y + 0$ The method 100 further includes step 114, which is to repeat steps 104, 106, 108, 110 and 112 for each product defined in step 102, e.g., each product used in Table 1.

The method 100 further includes step 116, which is to merge the data from all the files into one file. Thus, the various sized die will have "filled in" a large number of points on the wafer.

The method 100 further includes the step 118, which is to define a grid that is at the resolution of needed for the analysis. This can vary in size. A typical size useful for integrated circuit manufacturing purposes would be between 0.25 millimeters and 5 millimeters.

The method 100 further includes the step 120, which is to create a table with all the possible grid coordinates that would fit on a production wafer. This requires defining any regions on the wafer where die cannot be placed (e.g., title area, edge exclusion, clamp marks, etc.).

The method 100 further includes the step 122, which is to define a smoothing algorithm. The purpose of the smoothing algorithm is to use the non-uniform data in the combined composite map to estimate a predicted value for every coordinate on the uniform grid map defined in step 118. For example, a distance weighted smoothing algorithm with a Gaussian kernel to estimate each point could be used. Any smoothing algorithm can be used depending on what is judged to give the best estimate of the true value. The formula used, for example, is:

$$V_{x,y} = \frac{\sum_{i=1}^{n} V_i * (1 - (d/d_{max})^2)^2}{\sum_{i=1}^{n} (1 - (d/d_{max})^2)^2}$$

$V_{x,y}$ Is the smoothed value at location x,y
$V_i$ Is the known value i from the composite product dataset
n Is the total number of values in the composite product dataset
d Is the Euclidean distance $((x-x_i)^2+(y-y_i)^2)^{1/2}$
$d_{max}$ Is a user setting to limit a value beyond a max distance from affecting the smoothed average The method 100 further includes the step 124, which is to calculate the smoothed value for each point on the grid from the combined data. Table 6 shows an example final data table of the smoothed data set, using the foregoing formula.

TABLE 6

Smoothed Data Set Example

| Xmm | Ymm | Smoothed Value |
|---|---|---|
| −1 | 82 | 0.850 |
| −1 | 83 | 0.838 |
| −1 | 84 | 0.826 |
| −1 | 85 | 0.814 |
| −1 | 86 | 0.801 |
| −1 | 87 | 0.789 |
| −1 | 88 | 0.776 |
| −1 | 89 | 0.763 |
| −1 | 90 | 0.752 |
| −1 | 91 | 0.743 |
| −1 | 92 | 0.734 |
| −1 | 93 | 0.725 |
| −1 | 94 | 0.716 |
| −1 | 95 | 0.706 |
| −1 | 96 | 0.698 |
| −1 | 97 | 0.694 |
| 0 | −93 | 0.226 |

TABLE 6-continued

Smoothed Data Set Example

| Xmm | Ymm | Smoothed Value |
|---|---|---|
| 0 | −92 | 0.280 |
| 0 | −91 | 0.337 |
| 0 | −90 | 0.398 |
| 0 | −89 | 0.466 |
| 0 | −88 | 0.536 |
| 0 | −87 | 0.606 |
| 0 | −86 | 0.673 |
| 0 | −85 | 0.734 |
| 0 | −84 | 0.783 |
| 0 | −83 | 0.816 |
| 0 | −82 | 0.835 |

The method 100 further includes the step 126, which is to plot the wafer profile for various visualizations. For instance the wafer profile can be scaled in equal increments of the range of values, which in this case tends to highlight the high variability of the edge values, or the wafer profile can be scaled in equal percentiles of the data, which better highlights the more subtle variability in the center of the wafer. The wafer profile could also be plotted to show a three-dimensional contour map of the data.

Thus, the method 100 provides a number of features, including the following:

1. The use of die based data from multiple products of different die sizes (resolutions) to create a higher resolution wafer profile of the data;
2. Normalizing the data from the various die sizes so that they can be combined into a larger data set for the same parameter;
3. Conversion of the data from a set of disjointed virtual coordinate systems to a single physical coordinate system;
4. Applying smoothing or modeling algorithms to the non-uniformly populated data set to fully populate a uniform high-resolution grid;
5. The use of two-dimensional and three-dimensional plots to visualize the patterns on the wafer;
6. The use of the high-resolution maps to correlate the spatial patterns to manufacturing defect maps, and equipment configurations, and wafer handling methods to identify process improvement opportunities; and
7. The use of the high-resolution data table for other optimization calculations such as die placement for yield or auto-inking decisions for product quality improvement.

The method 100 also provides a number of advantages over the methods of the prior art, including:

1. Providing better resolution of spatial patterns on a wafer than the data from any single product can provide;
2. Normalizing and smoothing across the multiple products provides a map that better represents the process-induced patterns as opposed to any product specific pattern; and
3. The absolute physical coordinate system allows the data to be correlated to physical causes and use as data for modeling.

It should be noted that the method 100 could be run in a different order than as described hereinabove in order to achieve the same result in substantially the same way. For example, the physical grid association (step 120) could be done before the product normalization (step 112) or the data could be combined from different products (step 116) before being normalized (step 108).

It should further be noted that instead of a grid, some other coordinate method could be used to get the same result with substantially the same process, such as a polar coordinate system.

It should further be noted that any statistical smoothing algorithm could be used to fill in the non-uniform data.

It should further be noted that the method 100 could be applied to sample based data collection where only some of the dies have measurements. For example, E-test or critical dimension data that only test certain sites on the wafer. Because of the product layout differences the "same sites" on one product are actually in a slightly different physical location from another product. There is a resulting "cloud" of data at every site that can increase spatial resolution.

Finally, it should further noted that the method 100 could be applied to various collections of data that are all on a physical coordinate system not necessarily associated with a die boundary. An example application of this would be for a tool supplier to collect test wafer measurements from multiple fabs to determine a process profile with a larger dataset than could be generated from a single factory.

While an embodiment of the present invention is shown and described, it is envisioned that those skilled in the art may devise various modifications of the present invention without departing from the spirit and scope of the appended claims.

What is claimed is:

1. A method for calculating high-resolution wafer parameter profiles comprising the steps of:
   a) defining an appropriate product/device input dataset for a plurality of different die sizes and products, wherein the dataset comprises physical correlation reference points comprising information relating to the size of each die in two directions as well as the location of at least one of the corners of each die;
   b) collecting a die level yield bin dataset for one of the products/devices defined in step (a) by using the product/device input dataset to generate a table of data for the lots and wafers of said one of the products/devices with a virtual die coordinate for each die and a corresponding value;
   c) calculating a single composite value for each said virtual die coordinate;
   d) defining where on a virtual die it is desired to assign a composite value;
   e) calculating physical coordinates for each die value using the corresponding virtual coordinate and a physical translation key;
   f) repeating steps (b), (c), (d) and (e) for each of said die sizes and products defined in step (a);
   g) merging the data from a plurality of files into one file;
   h) defining a grid;
   i) creating a table with all possible grid coordinates that would fit on a production wafer;
   j) defining a smoothing algorithm;
   k) calculating the smoothed value for each point on the grid from the combined data; and
   l) plotting a wafer profile.

2. A method as defined in claim 1, further including the step of normalizing the composite die values so that they are mergeable with values from the other products.

3. A method as defined in claim 2, wherein a Poisson Defect Density normalizing algorithm is used to perform the step of normalizing the composite die values so that they are mergeable with values from the other products.

4. A method as defined in claim 2, wherein a max-mm scaling normalizing algorithm is used to perform the step of normalizing the composite die values so that they are mergeable with values from the other products.

5. A method as defined in claim 1, wherein said appropriate product/device input dataset of step (a) are defined by a variety of devices with die level data and different die sizes.

6. A method as defined in claim 1, wherein said appropriate product/device input dataset of step (a) are defined by products/devices which represent the same process flow to be modeled.

7. A method as defined in claim 1, wherein said appropriate product/device input dataset of step (a) are defined by a number of lots from each device to calculate an average result value for each die.

8. A method as defined in claim 1, wherein said appropriate product/device input dataset of step (a) are defined by die size for each device.

9. A method as defined in claim 1, wherein said appropriate product/device input dataset of step (a) are defined by at least one reference physical correlation point between a specific virtual coordinate and an actual physical location on the wafer.

10. A method as defined in claim 1, wherein said calculated single composite value for each die coordinate from step (c) is an average of the data from all the individual lots and wafers corresponding to the die site.

11. A method as defined in claim 1, wherein said calculated single composite value for each die coordinate from step (c) is a max of the data from all the individual lots and wafers corresponding to the die site.

12. A method as defined in claim 1, wherein said calculated single composite value for each die coordinate from step (c) is a sum of the data from all the individual lots and wafers corresponding to the die site.

13. A method as defined in claim 1, wherein said calculated single composite value for each die coordinate from step (c) is a percentage of the data from all the individual lots and wafers corresponding die site.

14. A method as defined in claim 1, wherein said composite value from step (d) is assigned to a corner of the die nearest an edge of the wafer.

15. A method as defined in claim 1, wherein said composite value from step (d) is assigned to a corner of the die nearest a center of the wafer.

16. A method as defined in claim 1, wherein said composite value from step (d) is assigned from a center of the die.

17. A method as defined in claim 1, wherein a Cartesian coordinate system is used to calculate physical coordinates from step (e).

18. A method as defined in claim 1, wherein a polar coordinate system is used to calculate physical coordinates from step (e).

19. A method as defined in claim 1, wherein the wafer profile is scaled, in accordance with step (l), in equal increments of a range of values.

20. A method as defined in claim 1, wherein the wafer profile is scaled, in accordance with step (l), in equal percentiles of the data.

21. A method as defined in claim 1, wherein the wafer profile is plotted, in accordance with step (l), to show a three-dimensional contour map of the data.

\* \* \* \* \*